United States Patent
Gupta et al.

(10) Patent No.: US 6,927,631 B2
(45) Date of Patent: Aug. 9, 2005

(54) WIDEBAND CMOS GAIN STAGE

(75) Inventors: Sandeep Kumar Gupta, Aliso Viejo, CA (US); Venugopal Gopinathan, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 349 days.

(21) Appl. No.: 10/226,228

(22) Filed: Aug. 23, 2002

(65) Prior Publication Data

US 2004/0036534 A1 Feb. 26, 2004

(51) Int. Cl.[7] .................................................. H03F 3/45
(52) U.S. Cl. ...................................................... 330/260
(58) Field of Search ................................. 330/260, 252, 330/253

(56) References Cited

U.S. PATENT DOCUMENTS

| | | | |
|---|---|---|---|
| 4,794,349 A | * | 12/1988 | Senderowicz et al. ...... 330/253 |
| 6,744,320 B2 | * | 6/2004 | Nguyen et al. ............. 330/254 |
| 2002/0053928 A1 | | 5/2002 | Enriquez ..................... 327/89 |

FOREIGN PATENT DOCUMENTS

| | | |
|---|---|---|
| EP | 0 139 078 A1 | 5/1985 |
| EP | 0 598 445 A1 | 5/1994 |

OTHER PUBLICATIONS

Hara, Shinji et al., "Broad–Band Monolithic Microwave Active Inductor and its Application to Miniaturized Wide–Band Amplifiers," IEEE Transactions on Microwave Theory and Techniques, vol. 36, No. 12, Dec. 1988, pp. 1920–1924.

Greshishchev, Yuriy M. and Schvan, Peter, "A 60dB Gain 55dB Dynamic Range 10Gb/s Broadband SiGe HBT Limiting Amplifier," 1999 IEEE International Solid–State Circuits Conference, pp. 382–383.

Masuda, Toru et al., "Transimpedance 32dB Limiting Amplifer and 40Gb/s 1:4 High–Sensitivity Demultiplexer with Decision circuit using SiGe HBTs for 40GB/s Optical Receiver," 2000 IEEE International Solid–State Circuits Conference, p. 60.

European Search Report from European Application No. 03019211.6, filed Aug. 25, 2003, 3 pages, Search Report published Jun. 4, 2004.

* cited by examiner

Primary Examiner—Douglas Wille
Assistant Examiner—Ginette Peralta
(74) Attorney, Agent, or Firm—Sterne Kessler Goldstein & Fox PLLC

(57) ABSTRACT

A CMOS gain stage includes biasing circuitry configured to insure saturation of a subsequent stage without a source follower circuit. The CMOS gain stage is optionally powered by a supply voltage that is greater than a permitted supply voltage for a processes technology that is used to fabricate the CMOS gain stage. In order to protect CMOS devices within the CMOS gain stage, optional drain-to-bulk junction punch-through protection circuitry is disclosed. A variety of optional features can be implemented alone and/or in various combinations of one another. Optional features include process-voltage-temperature ("PVT") variation protection circuitry, which renders a gain relatively independent of process, voltage, and/or temperature variations. Optional features further include bandwidth enhancement circuitry.

32 Claims, 10 Drawing Sheets

US 6,927,631 B2

WIDEBAND CMOS GAIN STAGE

BACKGROUND OF THE INVENTION

1. Field of the Invention

The present invention is directed to amplifiers and, more particularly, to amplifiers implemented with CMOS devices.

2. Related Art

Conventional amplifiers are implemented with bipolar transistor technologies, such as silicon germanium (SiGe), indium-Phosphide (InP), and other processes that offer high speed transistors. A bipolar amplifier is taught in Greshishchev, Y. M., and Schvan, P., "A 60 dB Dynamic Range 10 Gb/s Broadband SiGe HBT Limiting Amplifier," 1999 IEEE International Solid-State Circuits Conference (ISSCC99), Session 22, Paper WP22.4, page 282–383, 0-7803-5126-6/99, incorporated herein by reference in its entirety.

A disadvantage of bipolar process technologies is their relatively high cost, which is generally due to the number of mask layers needed. Another disadvantage is that relatively few foundries exist to provide these process technologies to fabrication-less ("fab-less") semiconductor companies. Digital CMOS processes are more suitable for the implementation of mixed analog/digital integrated circuit chips. So for the suitability of integration with the higher systems, CMOS processes are adopted more often than bi-polar processes. Yet another disadvantage of bipolar process technologies is the difficulty of integrating them with CMOS processes, which are nearly ubiquitous in the implementation of mixed analog/digital integrated circuit chips.

There is a need, therefore, for CMOS amplifiers, such as wideband CMOS gain stages.

BRIEF SUMMARY OF THE INVENTION

The present invention is directed to CMOS-implemented gain stages, including wide band CMOS gain stages. A CMOS-implemented gain stage can include biasing circuitry that substantially eliminates a need for a source-follower circuit. The biasing circuitry is configured to assure that one or more input transistor(s) of a subsequent stage are in a saturation region of operation.

CMOS gain stages in accordance with the invention can be powered by a relatively high supply voltage. Normally, a relatively high supply voltage could lead to gate oxide breakdown and/or drain to bulk junction punch-through. Gate oxide breakdown can occur when the gate to source voltage exceeds a threshold. In 0.13 $\mu$m processes, for example, gate oxide breakdown can occur above approximately 1.5 volts. The threshold tends to vary from foundry to foundry. In accordance with the invention, therefore, optional protection circuitry is provided to protect transistors within the CMOS gain stage from the relatively high supply voltage.

Optional bandwidth enhancement circuitry and process, voltage, and/or temperature ("PVT") variation protection circuitry, is also disclosed. The optional features described herein can be implemented alone and/or in various combinations with one another.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE FIGURES

The present invention will be described with reference to the accompanying drawings. The drawing in which an element first appears is typically indicated by the leftmost digit(s) in the corresponding reference number.

FIG. 8 is another schematic diagram of the CMOS gain stage 400, including optional drain-to-bulk junction punch-through protection circuitry that protects output transistors from drain-to-bulk junction punch-through.

FIG. 9 is another schematic diagram of the CMOS gain stage 400, including additional optional drain-to-bulk junction punch-through protection circuitry that protects input transistors from drain-to-bulk junction punch-through.

DETAILED DESCRIPTION OF THE INVENTION

Figure 1:
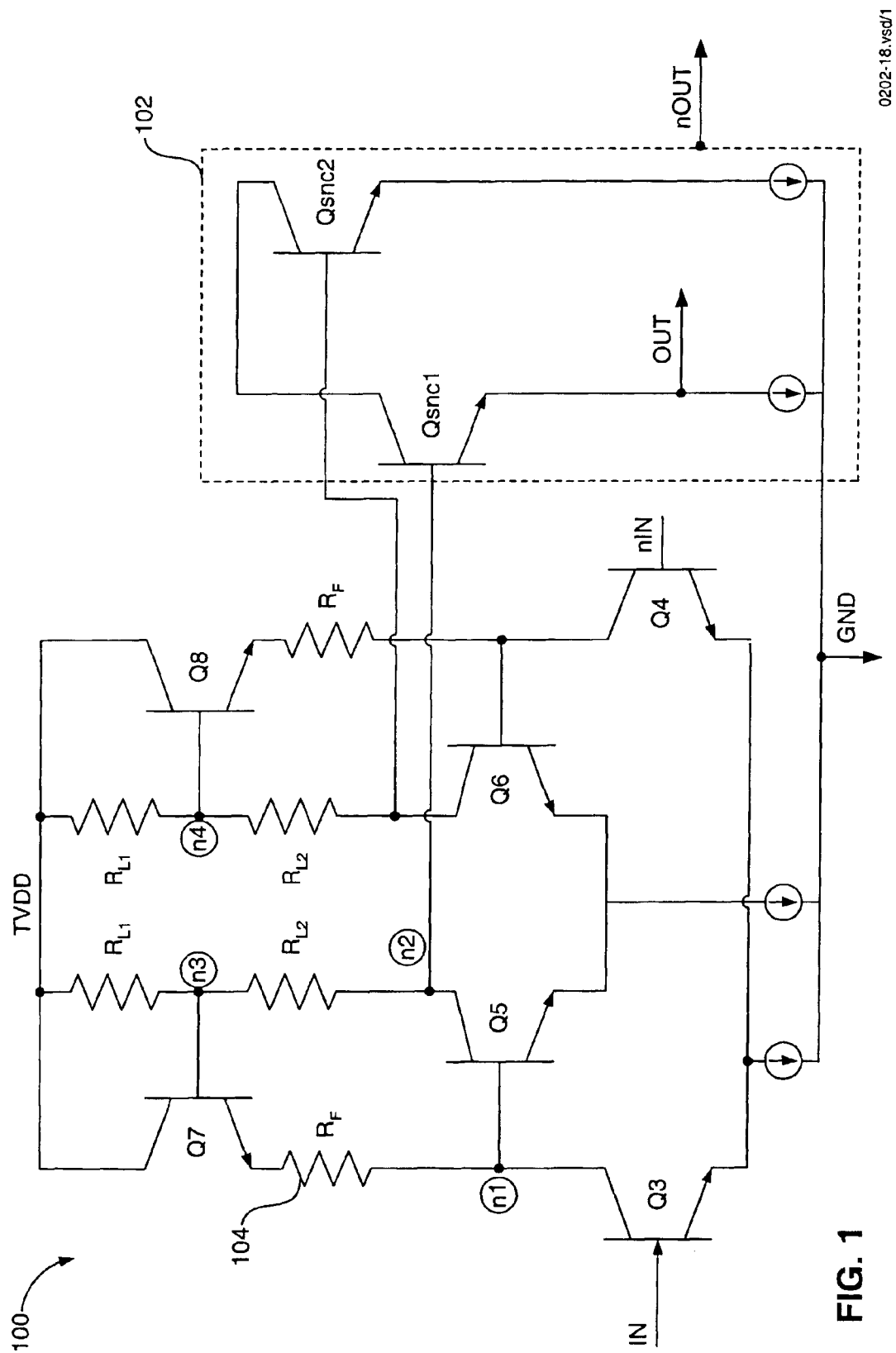
FIG. 1 is a schematic diagram of a bipolar amplifier.
Figure 2:
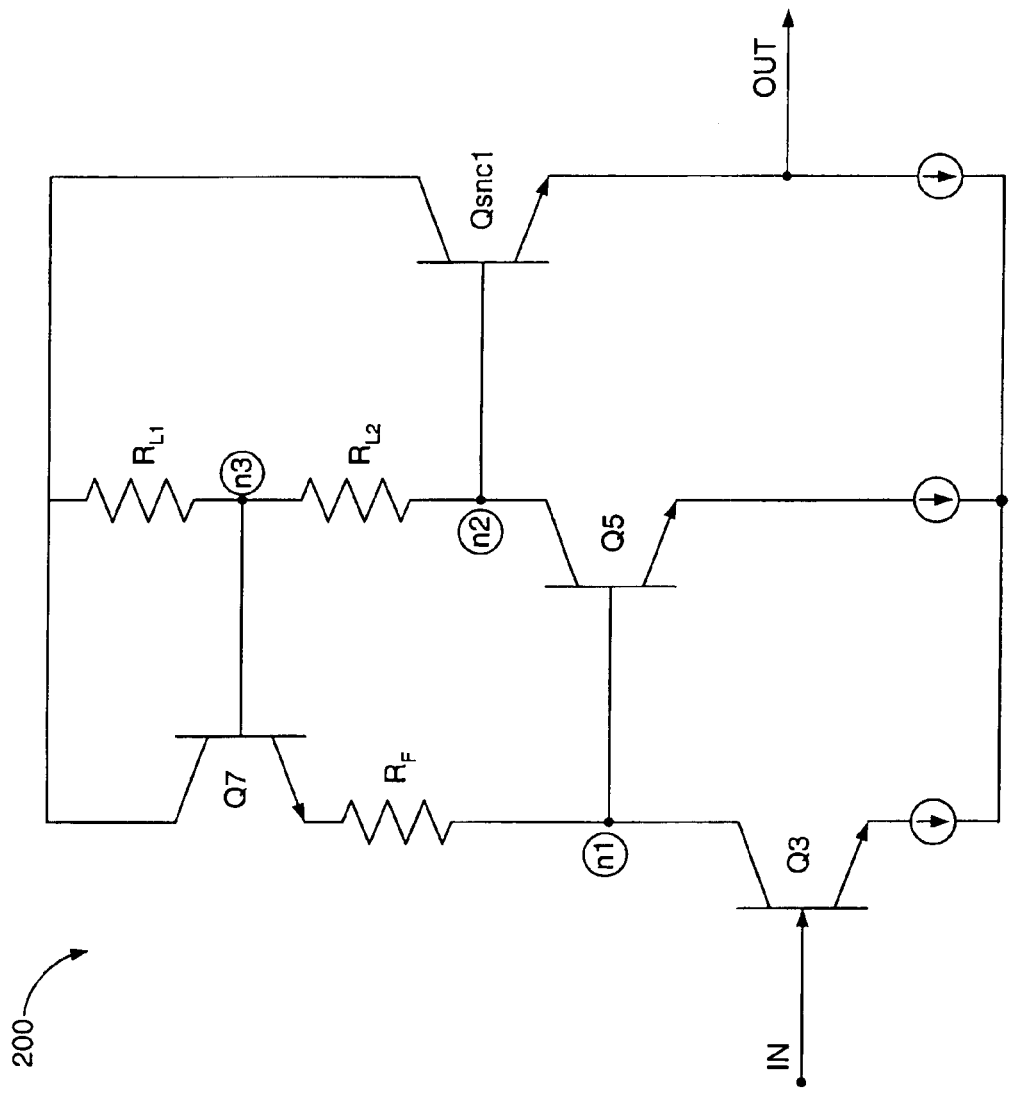
FIG. 2 is a schematic diagram of a bipolar "hay circuit," taken from the bipolar amplifier illustrated in FIG. 1.

Table of Contents
I. Bipolar Gain Stage
II. CMOS Gain Stage
  A. Introduction
  B. Bias Network Configured for an Output Source Follower
  C. Bias Network Configured for Omission of an Output Source Follower
  D. Supply Voltage and Drain-to-Bulk Junction Punch-Through
  E. PVT Independent Gain
  F. Bandwidth Enhancement
III. Conclusions I. Bipolar Gain Stage FIG. 1 is a schematic diagram of a bipolar amplifier 100. FIG. 2 is a schematic diagram of a bipolar "hay circuit" 200, which is taken from the bipolar amplifier 100 in FIG. 1. A gain of the bipolar amplifier 100 can be determined by analyzing the hay circuit 200.

The hay circuit 200 includes bipolar transistors Q3, Q5, and Q7, and resistors $R_{L1}$ and $R_{L2}$. The gain of the hay circuit 200 and of the bipolar-implemented amplifier 100 can be determined by denoting a resistive divider ratio "x," as shown in equation 1:

$$x = \frac{R_{L1}}{(R_{L1} + R_{L2})} \qquad \text{EQ. (1)}$$

Transconductances of the transistors Q3, Q5, Q7 are denoted as $gm_3$, $gm_5$, and $gm_7$, respectively. The gain "G" of the hay circuit 200 is given by equation 2:

$$G = \frac{gm_3 \cdot \left(R_F + \frac{1}{gm_7}\right)}{x + \frac{1}{[gm_5 \cdot (R_{L1} + R_{L2})]}} \qquad \text{EQ. (2)}$$

For bipolar transistors Q3 and Q7, $gm_3 \cong gm_7 \cong I_C/V_T$. The gain of an internal amplifier formed by Q5, $R_{L1}$ and $R_{L2}$, is given by equation 3:

$$A = gm_5 \cdot (R_{L1} + R_{L2}) \qquad \text{EQ. (3)}$$

Equation 2 can thus be rewritten as equation 4:

$$G = \frac{gm_3 R_F}{x + 1/A} \qquad \text{EQ. (4)}$$

With $gm_3 R_F$ being kept $>>1$. In this analysis, the gain of a source follower 102 (FIG. 1), is presumed to be close to unity.

Due to the relatively high value of the transconductances in bipolar devices, "A" can be much larger than "1/x". Thus, the gain G can be written as equation 5:

$$G \cong gm_3 R_F \left(\frac{1}{x}\right) \qquad \text{EQ. (5)}$$

Where "x" is <1. The gain "G" is thus directly increased due to the presence of the resistive divider circuit. Gains on the order of 10–20 can be achieved.

The bipolar amplifier 100 (FIG. 1) has a relatively high bandwidth because each of nodes n1–n4 has a low impedance. As a result, the poles contributed at each node by the presence of transistor junction capacitances and parasitic capacitances occur at relatively high frequencies, which leads to less bandwidth loss. Consider node n2, for example. The real impedance at node n2 is give by equation 6:

$$\frac{R_{L1} + R_{L2}}{gm_5(R_{L1} + R_{L2})} \qquad \text{EQ. (6)}$$

Feedback tends to reduce the output resistance by the gain. Equation 6 can be approximated as $1/gm_5$, which tends to be a relatively low value compared to $(R_{L1}+R_{L2})$, because $gm_5$ tends to be relatively large.

Similarly, consider node n1, where the real impedance is given by equation 7:

$$\frac{R_F + \frac{1}{gm_7}}{1 + gm_5 R_{L1}} \qquad \text{EQ. (7)}$$

The denominator in equation 7 is not $[1+gm_5(R_{L1}+R_{L2})]$, because the feedback is closed at the output of $R_{L1}$ only. At node n1, therefore, the impedance value is also relatively low, being divided by approximately the internal amplifier gain.

In bipolar technology, a resistor 104, also denoted as resistor $R_F$, is placed in series with load transistor Q7. This provides a gain >1 in that branch. Consider a case where RF=0. The gain of the leg then drops to $gm_3/gm_7$. Since the same current flows through both Q3 and Q7, their transconductances (gm) are equal, resulting in a gain of 1.

II. CMOS Gain Stage

A. Introduction

Figure 3:
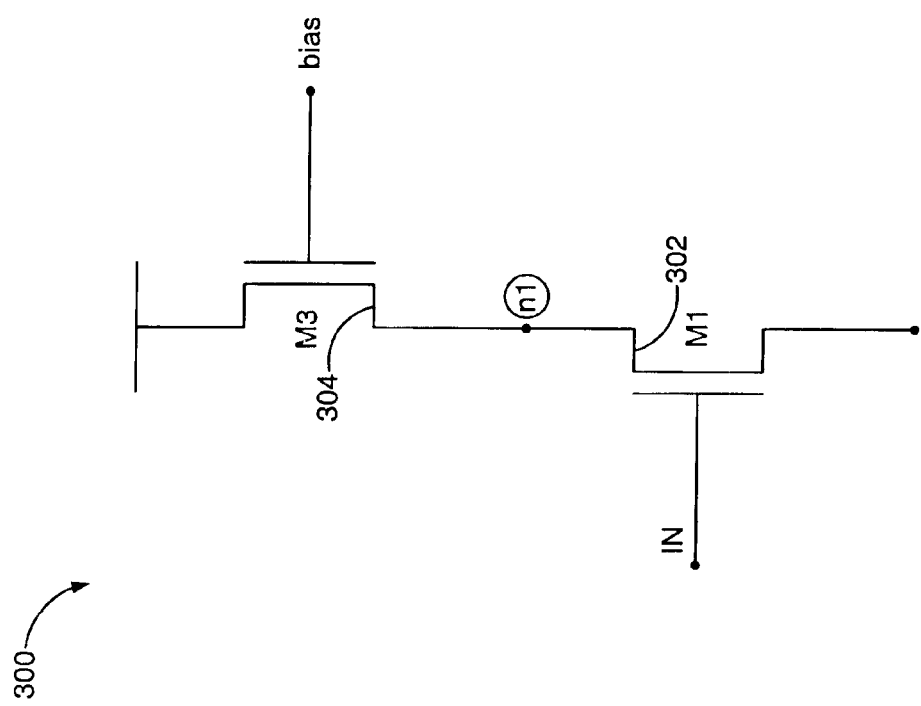
FIG. 3 is a schematic diagram of a CMOS gain stage leg 300, in accordance with the invention.

FIG. 3 is a schematic diagram of a CMOS gain stage leg 300, in accordance with the invention. The gain of the CMOS gain stage leg 300 is $gm_1/gm_3$, where $gm_1$ is a transconductance of a first CMOS device 302, also denoted as M1, and $gm_3$ is a transconductance of a second CMOS device 304, also denoted as M3.

The transconductance of MOSFET devices vary as a function of the length ("l") and widths ("w") of the integrated circuit traces. This is shown by equation 8.

$$gm \alpha \sqrt{(w/L) \cdot I} \qquad \text{EQ. (8)}$$

Thus, unlike bipolar devices, transconductances (gm) of MOSFET devices can be different from one another, even when the MOSFET devices carry the same current. This is accomplished by appropriately sizing the width/length (w/l) ratios of the devices. This allows CMOS gain stages that incorporate the leg 300, to be designed for relatively sizable gains. Notably, the relatively sizable gain in the CMOS gain stage leg 300 can be obtained without a series resistor. In CMOS implementations, therefore, the resistor RF (FIG. 1) is not needed.

Another advantage of the CMOS gain stage leg 300 is that transconductances of MOSFET devices can be made to track one another over process, voltage, and temperature variations. The CMOS gain stage leg 300 is thus less process-dependent than bipolar devices, where the gain was proportional to $gm_3 R_F$. Non-linearities of $gm_1$ and $gm_3$ in the CMOS gain stage leg 300 tend to cancel one another out to some extent.

Figure 4:
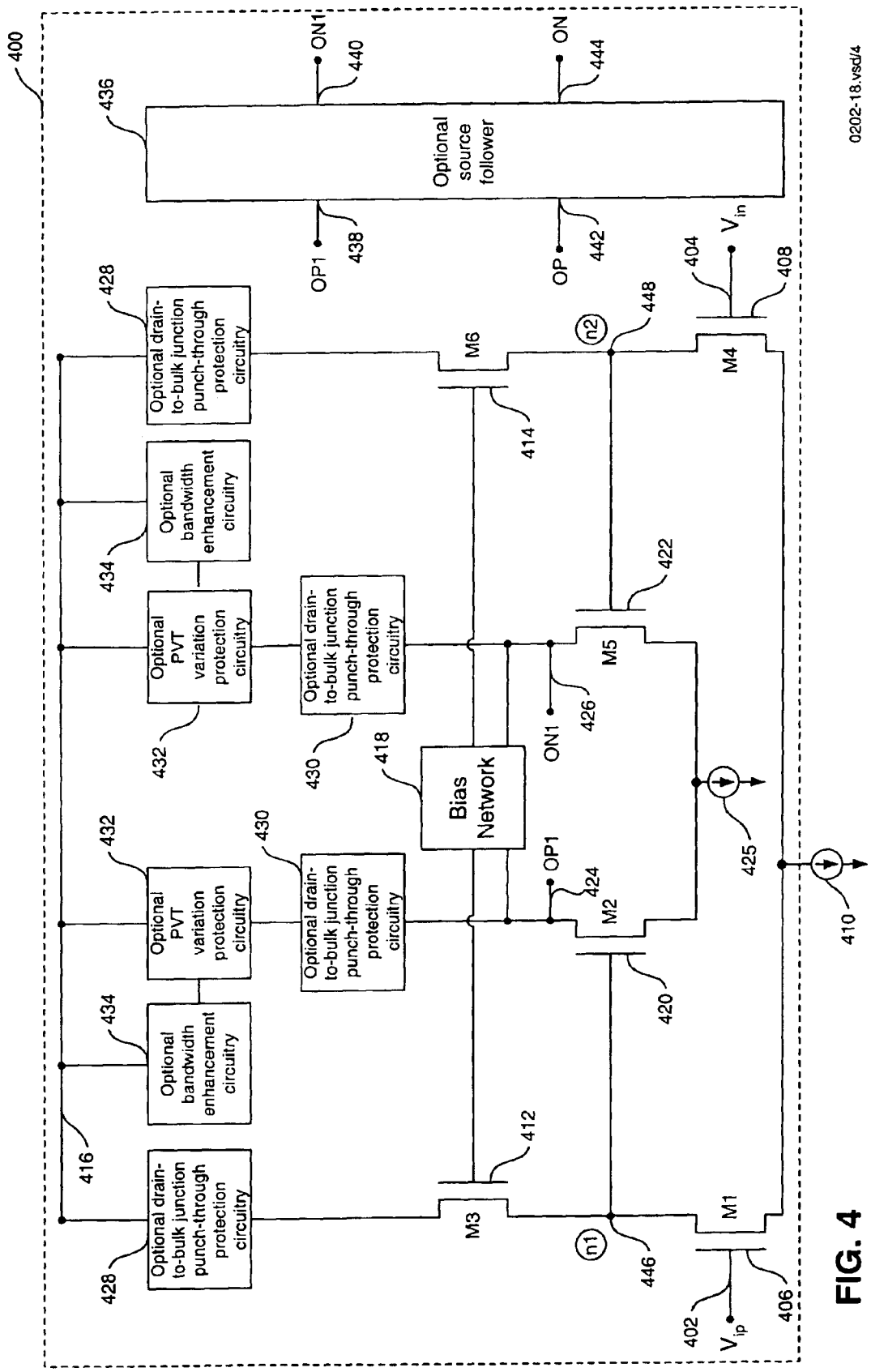
FIG. 4 is a schematic diagram of a CMOS gain stage 400, in accordance with the invention.

FIG. 4 is a schematic diagram of a CMOS gain stage 400 in accordance with the invention. The CMOS gain stage 400 incorporates the CMOS gain stage leg 300 of FIG. 3.

The CMOS gain stage 400 includes first and second input nodes 402 and 404, respectively, which receive a differential signal Vip and Vin. Alternatively, the first and second input nodes 402 and 404 receive a single-ended signal, wherein a signal is provided to one of the input nodes 402, 404, and the other input node is coupled to a fixed supply, such as a voltage supply or a ground.

When used herein, the terms "connected" and/or "coupled" are generally used to refer to electrical connections. Such electrical connections can be direct electrical connections with no intervening components, and/or indirect electrical connections through one or more components.

The CMOS gain stage 400 also includes first and second input CMOS transistors 406 and 408, respectively, also denoted as M1 and M4, respectively. The first and second input CMOS transistors 406 and 408 include gate terminals coupled to the first and second input nodes 402, 404, respectively. Source terminals of the input transistors M1 and M4 are coupled to an input stage current source 410.

The CMOS gain stage 400 further includes first and second feedback-controlled CMOS transistors 412 and 414, respectively, also denoted as M3 and M6, respectively. The first and second feedback-controlled CMOS transistors 412 and 414 include source terminals coupled to respective drain terminals of the input transistors M1 and M4. Gate terminals of the first and second feedback-controlled transistors M3 and M6 are coupled to a bias network 418, which is described below. Drain terminals of the feedback-controlled transistors M3 and M6 are coupled to a supply node 416, directly or through optional drain-to-bulk junction punch-through protection circuitry 428, which is described below.

The CMOS gain stage 400 further includes first and second output transistors 420 and 422, respectively, also denoted as M2 and M5, respectively. Source terminals of the first and second output transistors M2 and M5 are coupled to an output stage current source 425. Gate terminals of the first and second output transistors M2 and M5 are coupled to the drain terminals of the first and second input transistors M1 and M4, respectively. Drain terminals of the first and second output transistors M2 and M5 are coupled to the supply node 416, directly or through a load, which can include optional drain-to-bulk junction punch-through protection circuitry 430, optional process, voltage, and/or temperature ("PVT") variation protection circuitry 432, and/or optional bandwidth enhancement circuitry 434, all of which are described below. Drain terminals of the first and second output transistors M2 and M5 are coupled to first and second output nodes 424 and 426, respectively, are also denoted as "OP1" "ON1."

Bias network 418 is coupled between the gate terminals of the feedback-controlled transistors M3 and M6, and the output nodes 424 and 426. The bias network 418 biases the transistors M3 and M6 to insure proper saturation of an output source-follower 436, discussed below, and/or of an input device of a subsequent gain stage, also discussed below. An input device (e.g., transistor) of a subsequent gain stage should be maintained in saturation because transistors have higher transconductances (i.e., gm) and thus larger gains, in saturation.

When implemented, the output source-follower 436 helps to insure proper saturation of an input device of a subsequent stage. The output source-follower 436 includes first and second source-follower input nodes 438 and 440, also denoted "ON1" and "OP1," respectively. The output source-follower input nodes 438 and 440 are coupled to the output nodes 424 and 426, respectively. The output source-follower 436 includes first and second source-follower output nodes 442 and 444, respectively, also denoted "ON" and "OP," respectively. The source-follower output nodes 442 and 444 serve as the output nodes of the CMOS gain stage 400. Alternatively, when the output source-follower 436 is omitted, as described below, the first and second output nodes 424 and 426 (OP1 and OP2, respectively), serve as the output nodes of the CMOS gain stage 400. The output nodes of the CMOS gain stage 400 can be coupled to input devices of a subsequent gain stage.

Output source followers are difficult to implement in CMOS circuits due to limitations described herein. Output source followers also consume power and tend to degrade performance. Thus, the source follower 436 is optionally omitted by configuring the biasing circuitry 418 to insure proper saturation of an input device of a subsequent stage, without use of the source follower 436. This is described below with reference to FIG. 7.

In FIG. 4, the input transistors M1 and M4, and the feedback-controlled transistors M3 and M6 form an input stage of the CMOS gain stage 400. The first input transistor M1 and the first feedback-controlled transistors M3 form a first leg of the input stage. The first leg of the input stage includes a node 446, also denoted n1. The node n1 serves as an output of the input stage. The first leg of the input stage has a gain that can be defined as a ratio between an input signal level at the first input node 402 and a signal level at the node n1. The gain of the first leg of the input stage is a function of transistors M1 and M3, and of the optional drain-bulk junction punch-through protection circuitry 428, as described below.

An output stage of the CMOS gain stage 400 is formed by the output transistors M2 and M5, the output source follower 436 (when implemented), the bias network 418, the optional drain-to-bulk junction punch-through protection circuitry 430, the optional PVT variation protection circuitry 432, and the optional band-width enhancement circuitry 434. A first leg of the output stage is formed by the transistor M2, and relevant portions of the bias network 418, the optional drain-to-bulk junction punch-through protection circuitry 430, the optional PVT variation protection circuitry 432, and the optional band-width enhancement circuitry 434. The first leg of the output stage has a gain that can be defined as a ratio between a signal level at the node n1, and a signal level at the output node 424. The gain of the first leg of the output stage is a function of the transistor M2, the bias network 418, the optional drain-to-bulk junction punch-through protection circuitry 430, the optional PVT variation protection circuitry 432, and the optional band-width enhancement circuitry 434, as described below.

In operation, the CMOS gain stage 400 receives a differential signal, single-ended or double-ended, at the input nodes 402 and 404. The CMOS gain stage 400 outputs a differential signal, single-ended or double-ended, at the output nodes 424 and 426. A potential difference between the output nodes 424 and 426 is "gained-up" from a potential difference between the input nodes 402 and 404.

The CMOS gain stage 400 can be configured with one or more of a variety optional features. For example, with at least some configurations of the bias network 418, the CMSO gain stage 400 is powered by a relatively high supply voltage, as described above. When a relatively high supply voltage is used (e.g., to support the bias network 418), the CMOS gain stage 400 can include the optional drain-to-bulk junction punch-through protection circuitry 430 to avoid potential drain-to-bulk punch-through that could otherwise occur for devices M2 and M5. The optional drain-to-bulk junction punch-through protection circuitry 430 can also be implemented to substantially prevent a gate-to-source capacitance, Cgs, of transistors within the PVT variation protection circuitry 432 from appearing at the output. This is described below with reference to FIG. 8.

Similarly, the CMOS gain stage 400 can include the optional drain-to-bulk junction punch-through protection circuitry 428 to avoid potential drain-to-bulk punch-through that could otherwise occur for devices M3 and M6. This is described below with reference to FIG. 9.

The CMOS gain stage 400 can include the optional PVT variation protection circuitry 432, which renders a gain of the CMOS gain stage 400 relatively independent of process, voltage, and/or temperature variations. This is described below with reference to FIG. 6.

Figure 10:
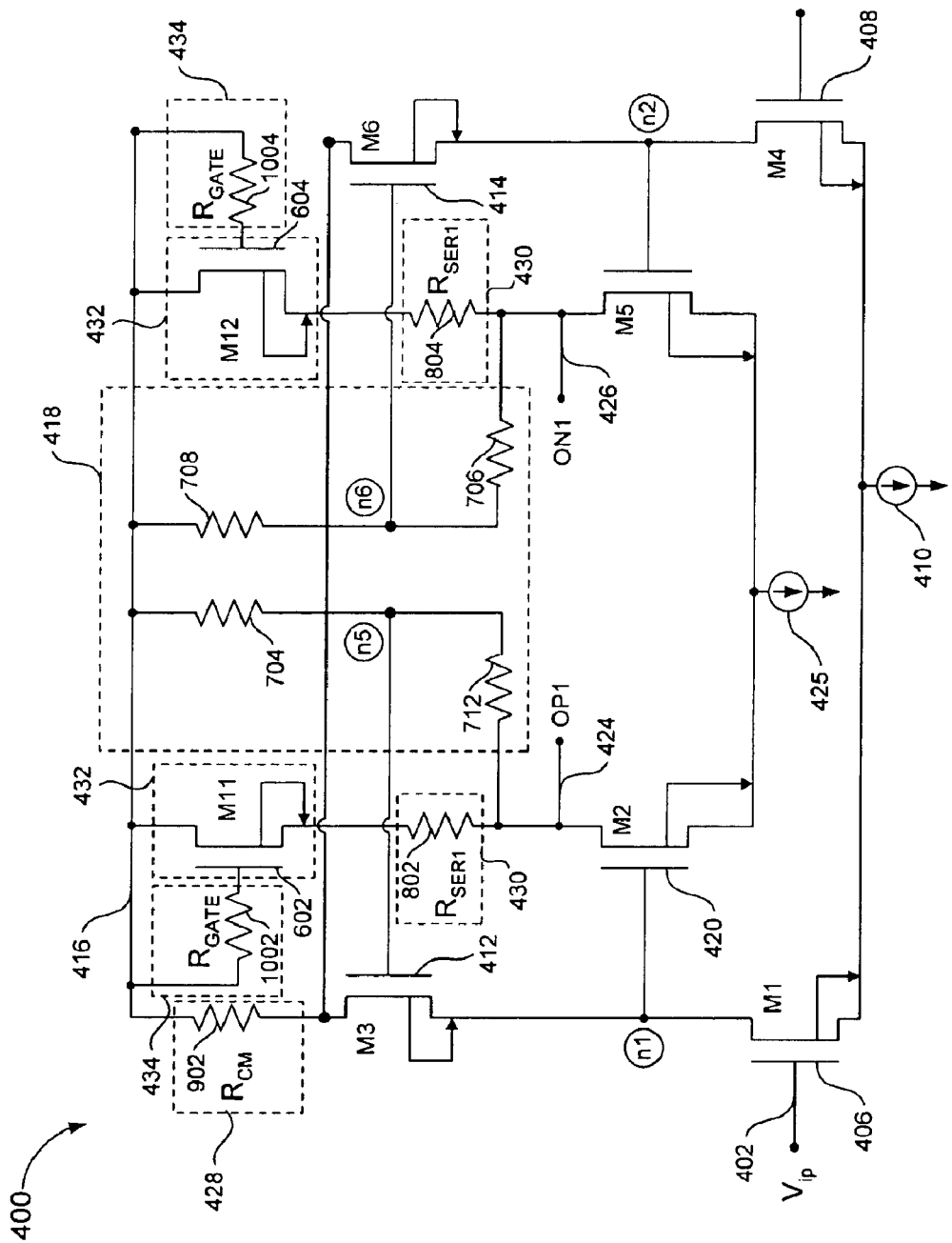
FIG. 10 is another schematic diagram of the CMOS gain stage 400, including optional bandwidth enhancement circuitry.

The CMOS gain stage 400 can include the optional bandwidth enhancement circuitry 434 is described below with reference to FIG. 10. The optional features described herein can be implemented alone and/or in various combinations with one another.

B. Bias Network Configured for an Output Source Follower

Figure 5:
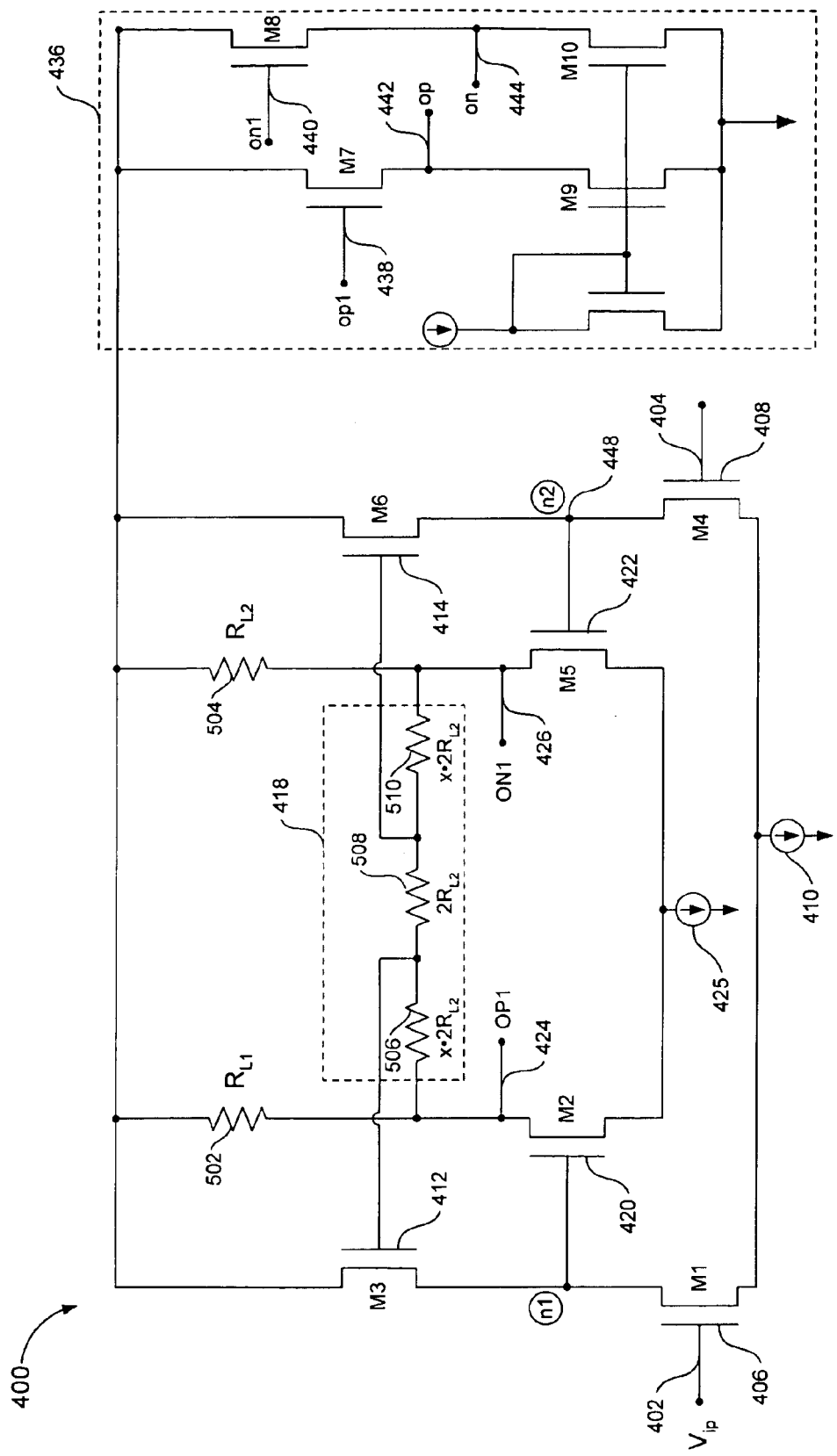
FIG. 5 is another schematic diagram of the CMOS gain stage 400, including gain resistors $R_{L1}$ and $R_{L2}$.

FIG. 5 is a schematic diagram of the CMOS gain stage 400 wherein the bias network 418 is configured to operate with the output source-follower 436. The output source-follower 436 helps to insure proper saturation of an input device of a subsequent stage, as described below.

In the example of FIG. 5, the bias network 418 includes a plurality of series-connected resistances 502, 504, and 505, also denoted here as x•$R_{L2}$, 2•$R_{L2}$, and x•$R_{L2}$, respectively. In addition to biasing the feedback-controlled transistors M3 and M6, the plurality of series-connected resistances 506, 508, and 510, in conjunction with the resistances 502 and 504, contribute to the gain of the CMOS gain stage 400.

In FIG. 5, the CMOS gain stage 400 also includes resistances 502 and 504, which are also denoted as $R_{L1}$ and $R_{L2}$. The resistances $R_{L1}$ and $R_{L2}$ provide gain advantages as described above. The resistances $R_{L1}$ and $R_{L2}$ can be omitted when the optional PVT variation protection circuitry 432 is utilized, as described below.

In the CMOS gain stage 400 illustrated in FIG. 5, there is no resistor in series with the drain terminal of M3. As a result, the gain of the first leg of the input stage is equal to $gm_1/gm_3$. Since M3 and M1 are typically on the same integrated circuit chip, PVT variations tend to affect M1 and M3 to the same degree. These affects tend to cancel one another out. The gain $gm_1/gm_3$ is thus relatively independent of PVT variations. Additionally, non-linearities tend to cancel out.

Configuration of the bias network 418 for the output source follower 436 is now described. The output source follower 436 can be used to drive another similar gain stage. To ensure that input devices of the next stage are held in saturation, the voltage at the outputs OP and ON should not be too high. Using approximate replica biasing, which is described below, the source-follower 436 substantially ensures that the nodes n1 and n2 of a subsequent gain stage are close to a common mode of the output nodes OP and ON, thus insuring the correct output level (i.e., the input to the subsequent stage), to maintain input devices of the subsequent stage in saturation.

Figure 6:
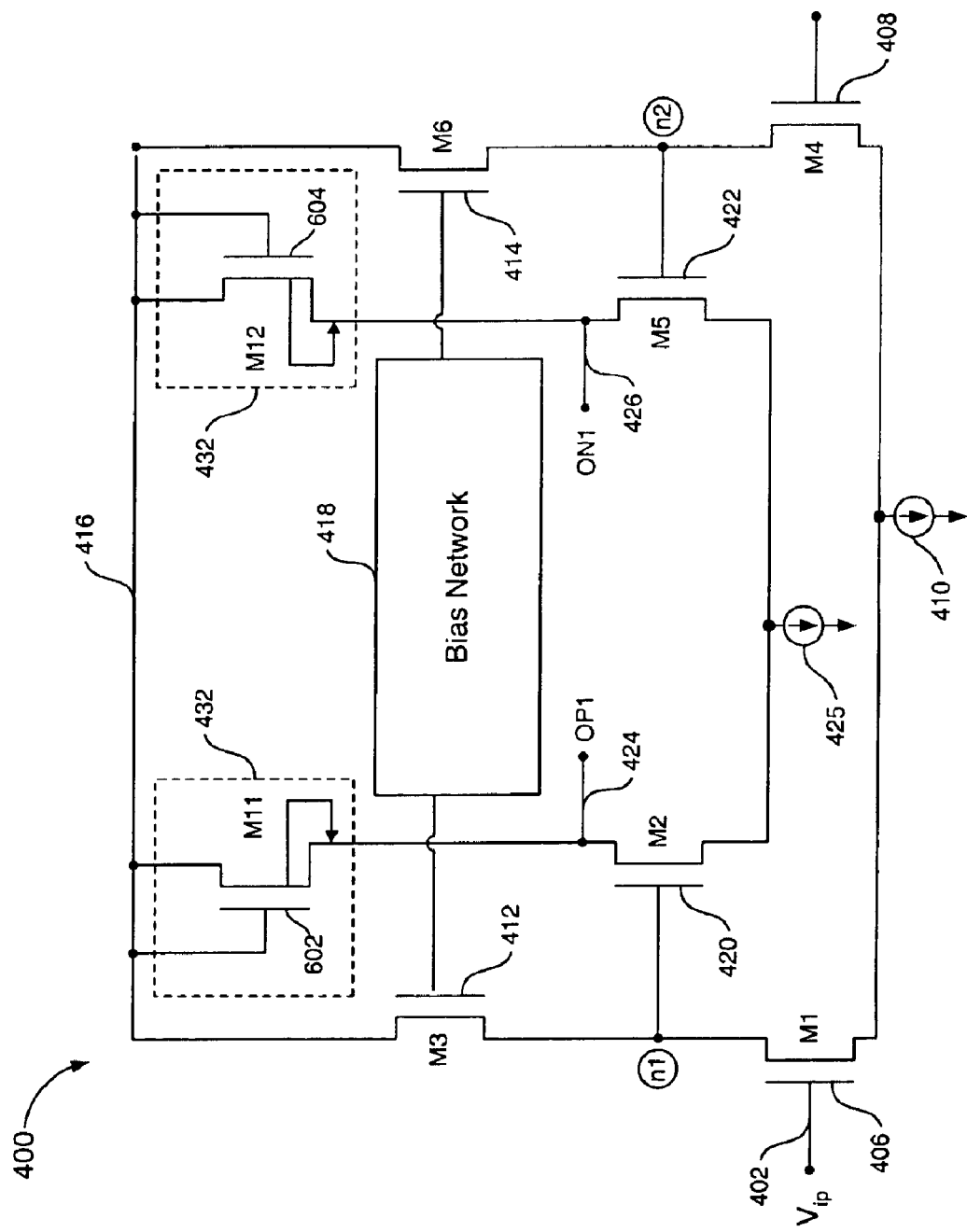
FIG. 6 is another schematic diagram of the CMOS gain stage 400, including optional PVT variation protection circuitry in place of the resistors $R_{L1}$ and $R_{L2}$.

Regarding approximate replica biasing, the OP and ON voltage should be roughly equal to the voltage at nodes n1 and n2, respectively. In FIG. 6, for example, for the feedback to M3, the gate common mode voltage is essentially the same as the common mode at OP1 and ON1. This is because of the connections between the resistors in the bias network 418, so there is no drop across the resistors, common mode wise. Thus, the gate voltage of M3 is essentially the same as the voltage at OP1, common mode wise, but not necessarily differentially. Therefore, the node n1 is 1 vgs drop below the common mode of OP1 and ON1. M7 and M8 produce the output voltage Op and On, which is 1 vgs below OP1 and ON1. This is what is meant by replica biasing. Thus, the voltages OP and ON are essentially the same common mode voltage as node n1 and n2. That is the purpose of the source follower 436. The source follower 436 maintains essentially the same common mode at the output as node n1. Inputs OP and ON of the subsequent stage will have their own associated nodes n1 and n2, but the OP and ON are such that they are about equal to the n1 and n2 of the next stage. This insures that the input device of the next stage will be held in saturation. This is a reason for using the source follower. Other potential purposes of the source follower 436 include low impedance output to the subsequent stage so it can drive the next stage easily.

Source follower 436 can be compared to a leg formed by transistor M3. M3 and M7 are sized proportional to their respective DC currents to insure similar vgs drops. This assures that the OP and ON common mode voltages are substantially equal to n1 and n2 common mode voltages. Nodes n1 and n2 of a subsequent stage are close to a common mode of the output OP and ON.

The gain of the source follower formed by M7 and M9 is approximately given by equation 10.

$$G_{SF} = \frac{gm_7}{gm_7 + gmb_7 + gds_9} \quad \text{EQ. (10)}$$

Where $gmb_7$ is a transconductance parameter modeled to incorporate the body effect of M7, and $gds_9$ is a drain-to-source conductance of M9.

The output source-follower 436 is suitable for many applications. In CMOS implementations, however, design considerations favor omission of the optional source-follower 436. For example, in MOS implementations, source-followers tend to be difficult to design for high speed operation. This is due to a relatively strong body effect of the transistor M7 and to the finite output resistance of device M9 in deep sub-micron technology. This tends to result in gain reduction. Moreover, transconductances in MOS technology tend to be much smaller than in bipolar technology. As a result, driving the transistor junction, the gate capacitance, and the parasitic capacitance is difficult, causing the CMOS gain stage 400 to lose speed. The gain and speed issues can be overcome, at least to some extent, with various circuit techniques. Nevertheless, real estate requirements and power consumption can be reduced by performing the functions of the source-follower 436 with other techniques. Other considerations may also lead a designer to want to use other techniques to perform the functions of the source-follower 436, as described below.

The gain of the CMOS gain stage 400 illustrated in FIG. 5 is given by equation 11.

$$G = \frac{gm_1}{gm_3} \frac{1}{\left[\left(x + \frac{1}{gm_2 R_{L1}}\right)\right]} \quad \text{EQ. (11)}$$

Where $gm_2 R_{L1}$ is relatively large, equation 11 simplifies to equation 12.

$$G = \frac{gm_1}{gm_3} \cdot \left(\frac{1}{x}\right) \quad \text{EQ. (12)}$$

In equation 12, the gain depends on ratios rather than absolute parameters, and is thus relatively PVT independent. In MOS applications, however, where higher bandwidth is desired, $R_{L1}$ is typically kept relatively low. In addition, the transconductance $gm_2$ is generally lower than in bipolar transistors. In such situations, $1/gm_2 R_{L1}$ becomes almost comparable to "X," and hence cannot be ignored. In at least these situations, the optional source-follower 436 can be advantageously omitted as described below with respect to FIG. 7.

C. Bias Network Configured for Omission of the Source Follower

Figure 7:
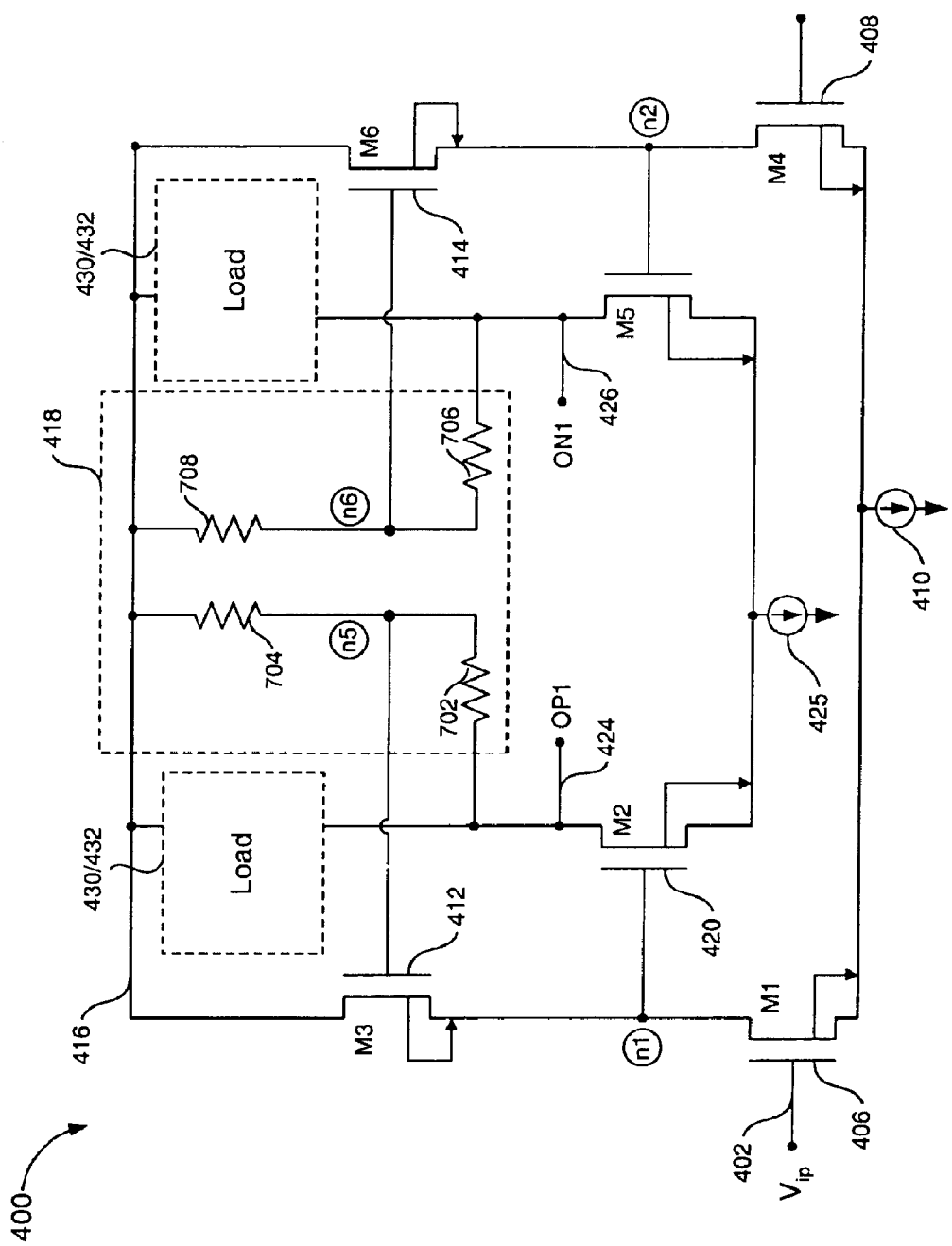
FIG. 7 is another schematic diagram of the CMOS gain stage 400, wherein a source follower circuit is omitted and a bias network is configured with resistive divider circuits to insure proper saturation of an input device of a subsequent gain stage.

FIG. 7 is a schematic diagram of the CMOS gain stage 400, wherein the source follower is omitted and the bias network 418 is configured with resistive divider circuits coupled between the supply node 416 and the output nodes 420 and 422. The resistive divider circuits bias M3 and M6.

In the example of FIG. 7, a first resistive divider circuit includes resistances 702 and 704, and a node n5 there between. A second resistive divider circuit includes resistances 706 and 708, and a node n6 there between. The first resistive divider circuit is coupled between the supply node 416 and the drain terminal of M2. The second resistive divider is coupled between the supply node 416 and the drain terminal of M5. Nodes n5 and n6 are coupled to respective gate terminals of M3 and M6. This configuration of bias network 418 raises the common mode at the nodes n5 and n6, which is supplied to the gates of M3 and M6. This helps to maintain the nodes n1 and n2 of a subsequent stage at a voltage that is approximately equal to the input voltage of the CMOS gain stage 400. Therefore, the node voltages at OP1 and ON1 approach n1 and n2 in this gain stage cell. So we raised OP1 and ON1, and then dropped them. Nodes n5 and n6 have a raised common mode with respect to OP1 and ON1, which is then lowered by M3 and M6. The resistor ratios are kept such that OP1 and ON1 are close to n1 and n2, respectively, but not necessarily identical. For saturation of the next stage, the input of next stage does not have to be equal to n1 and n2 for saturation, just relatively close. This is referred to herein as trickle biasing. OP1 and ON1 thus come close to the common mode of n1 and n2, which insures saturation of the input devices to the next stage. The resistive divider circuits perform an approximate function of providing a common mode voltage raise approximately equal to the vgs drops of M3 and M5.

Recall from above that an input device (e.g., transistor) of a subsequent gain stage should be maintained in saturation because transistors have higher transconductances (i.e., gm) and thus larger gains, in saturation. In FIG. 5, replica biasing provided by the output source follower 436 insures saturation of an input device of a subsequent stage. In FIG. 7, however, the source follower has been omitted. Instead, the bias network 418 provides feedback control so that OP1 and ON1 are at a common mode voltage, which insures that an input device of a subsequent stage is held in saturation.

A transistor is in a saturation condition when the drain voltage (Vd) of the transistor is greater than the gate voltage (Vg) minus the threshold of the transistor (Vt), as illustrated by equation (13):

$$Vd > Vg - Vt \qquad \text{EQ (13)}$$

If the drain voltage is equal to the gate voltage, then the inequality of equation (13) is satisfied for any positive threshold voltage Vt. For example, where Vg=500 mv and Vt=200 mv, Vg–Vt=300 mv. If Vd equals 500 mv, for example, Vd (i.e., 500 mv)>(Vg–Vt), (i.e., 300 mv). In other words, for threshold voltages greater than zero, the inequality of equation (13) is satisfied Vd=Vg. For 0.13 $\mu$m technology, for example, threshold voltages are typically in the range of about 300 mv to 400 mv, although threshold voltages tend to be foundry-process-dependent. So for 0.13 $\mu$m technology, the inequality of equation (13) will be satisfied for any Vd that is greater than Vg minus 300 mv to 400 mv. The invention is not, however, limited to 0.13 $\mu$m technology.

Th voltage at n1 is approximately equal to the voltage at OP1, plus the resistive divider voltage at node 5, minus the voltage (Vgs) across M3. The resistive divider is designed so that the voltage at node 5 is maintained relatively close to the voltage (Vgs) across M3. The voltage at n1 is thus maintained approximately equal to the voltage at OP1. In practice, the voltage at node n1 is typically less than or equal to the voltage at OP1. Since, OP1 is maintained close to the bias of node n1, the inequality of equation (13) is satisfied. Since OP1 is providing the input Vip to a subsequent stage, an input device of the subsequent stage will be maintained in saturation.

In the example of FIG. 7, transistors are illustrated with their bodies tied to their respective source terminals. This helps to avoid body effects of the transistors. The body-to-source ties are not essential, but can be useful in many applications.

D. Supply Voltage and Drain-to-Bulk Junction Punch-Through

Deep sub-micron technologies typically require a relatively low supply voltage. The circuits described herein, however, require relatively higher supply voltages. For example, referring back to FIG. 5, looking through the path that includes the output stage current source 425, M2, M3, $X \cdot R_{L2}$, and $R_{L1}$, the supply node 416 should be coupled to a supply that is equal to or greater than:

$$2Vgs + 1Vds + 2IR \text{ drop}$$

Where Vgs is the gate-to-source voltage for M2 and M3, Vds is the drain to source voltage for M2, and "IR drop" is a voltage drop across the resistors $X \cdot R_{L2}$, and $R_{L1}$. In 0.13 $\mu$m technology, for example, the supply node 416 should be greater than 2 volts to support these drops. A similar analysis applies to the CMOS gain stage 400 illustrated in FIG. 7.

Deep sub-micron process technologies, however, generally do not normally support higher supply voltages. Thus, it is unconventional to use such a large voltage for deep sub-micron process technologies, such as 0.13 $\mu$m process technologies, for example. Reasons for this include potential gate oxide breakdown, drain-to-bulk junction punch-through, and source-to-bulk junction punch-through, all of which can happen at relatively low voltages. Gate oxide breakdown depends on the gate to source voltage of the transistor, which should not exceed a certain amount (e.g., less than 2 volts for 0.13 $\mu$m process technologies). Drain-to-bulk junction punch-through depends on the drain to bulk voltage. Source-to-bulk junction punch-through depends on the source to bulk voltage. The latter is not typically an issue, however, because the source voltage is typically below the drain voltage and is not generally coupled directly to the power supply. The drain and gate voltages, on the other hand, can be at higher voltages, possibly even coupled directly to the power supply. Where the power supply is a relatively high supply voltage, breakdown could occur absent protection.

Foundries typically determine the maximum allowable supply voltage, or threshold, based on the minimum transistor length that can be fabricated using a given process technology. In accordance with the invention, therefore, a CMOS gain stage, which is coupled to a supply voltage that exceeds the foundry-permitted supply voltage for a give processes technology, includes protection circuitry. Gate oxide breakdown is prevented with protection circuitry that prevents Vgs from exceeding the threshold. Drain-to-bulk junction punch through is prevented by insuring that drain-to-bulk voltage never exceeds the threshold. Drain-to-source bulk junction punch-through can be avoided with the optional drain-to-bulk junction punch-through protection circuitry 430, as described below with respect to FIG. 8, and/or with the optional drain-to-bulk junction punch-through protection circuitry 428, described below with respect to FIG. 9. The drain-to-bulk junction protection circuitry illustrated in FIGS. 8 and 9 have the added advantage of providing gate oxide breakdown protection as well.

Generally, gate oxide breakdown protection circuitry and/or drain-to-bulk junction punch-through protection circuitry is designed to protect one or more of M1 through M6. In the examples provided herein, M3 and M6 are protected by drain-to-bulk junction punch-through protection circuitry 428, which also protects M1 and M4. M2 and M5 are protected by drain-to-bulk junction punch-through protection circuitry 430. Additionally, or alternatively, drain-to-bulk junction punch-through protection of M2 and M5 is provided by PVT variation protection circuitry 432, as described below. The invention is not, however, limited to the examples provided herein. Based on the description herein, one skilled in the relevant art(s) will understand that other circuitry can be utilized to provide gate oxide breakdown protection, including drain-to-bulk junction punch-through protection and/or source-to-bulk junction punch-through protection.

Figure 8:
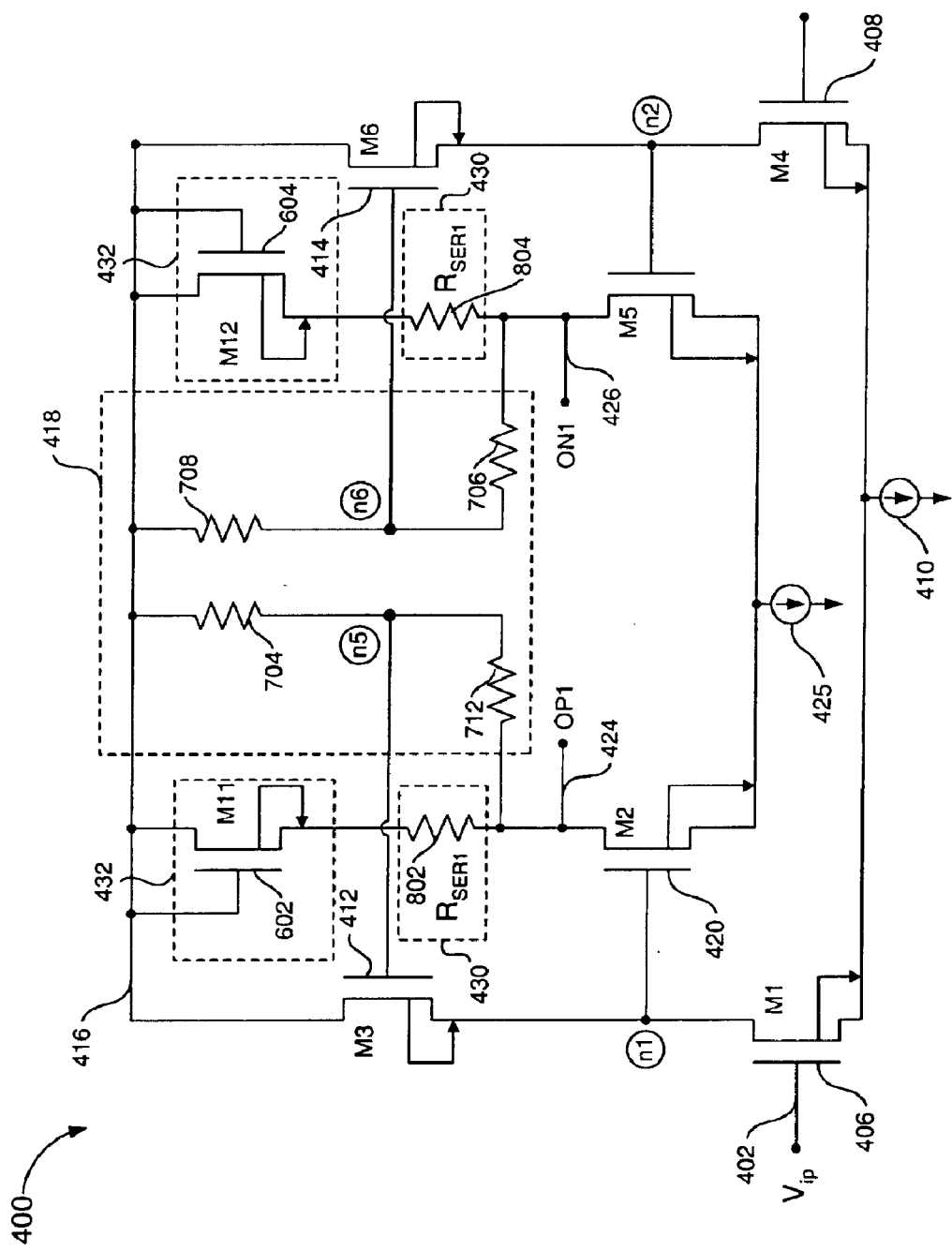

In FIG. 8, the CMOS gain stage 400 includes the optional drain-to-bulk junction punch-through protection circuitry 430, which protects M2 and M5 from drain-to-bulk junction punch-through. In this example, the optional drain-to-bulk junction punch-through protection circuitry 430 includes first and second series resistances 802 and 803, also denoted as $R_{Ser1}$, between the drain terminals of M2 and M5 and the supply node 416. The resistances $R_{Ser1}$ reduce the voltage at the drain terminals of M2 and M5. The reduced voltage reduces the potential drain-to-bulk punch-through that could otherwise occur for devices M2 and M5.

Where, as in this example, the optional PVT variation protection circuitry 432 is implemented as in FIG. 6, the series resistances $R_{Ser1}$ also substantially prevent the gate-to-source capacitance of M11 and M12 from appearing directly at the output nodes 424 and 426.

In the example of FIG. 8, the gain of the CMOS gain stage 400 is given by equation 14.

$$G = \frac{gm_1}{gm_3} \cdot \frac{1}{\left[x + \frac{1}{gm_2 \cdot \left(R_{ser} + \frac{1}{gm_{11}}\right)}\right]} \quad \text{EQ. (14)}$$

Generally, the resistances $R_{Ser}$ should be relatively small, for example, less than $1/gm_{11}$ or $1/gm_{12}$, so that it limits gain sensitivity to PVT variations.

Figure 9:
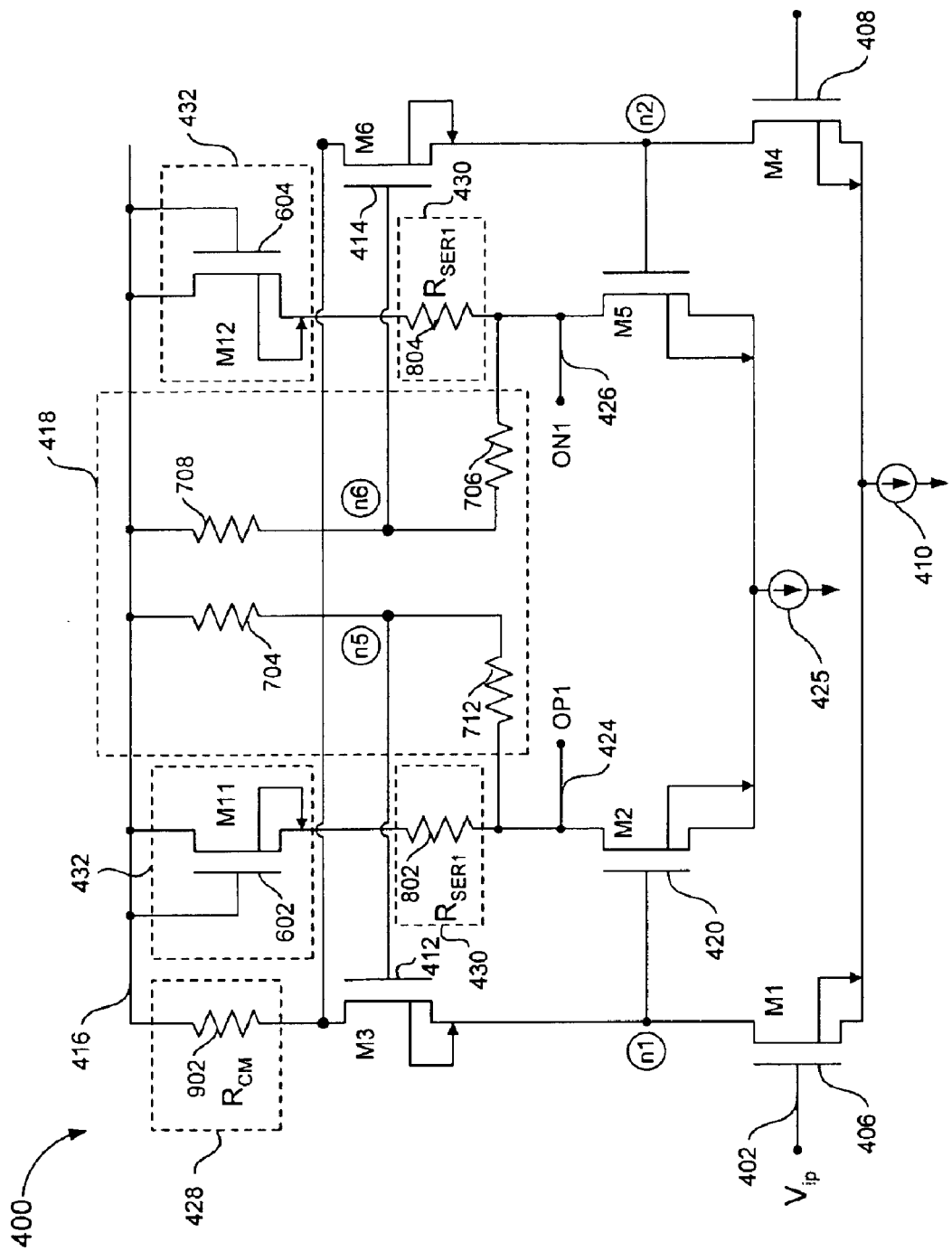

In FIG. 9, the CMOS gain stage 400 further includes the optional drain-to-bulk junction punch-through protection circuitry 428, which protects M3 and M6 from drain-to-bulk junction punch-through. The optional drain-to-bulk junction punch-through protection circuitry 428 includes a common mode resistance 902, also denoted as $R_{CM}$, coupled between the supply node 416 and the drain terminals of M3 and M6. The common mode resistance $R_{CM}$ reduces the voltage at the drain terminals of M3 and M6, and thus helps to prevent drain-to-bulk punch-through of M3 and M6.

Drain-to-bulk junction punch-through protection and gate oxide breakdown protection is typically implemented on a transistor by transistor basis. In other words, each transistor in the circuit is provided with protection circuitry, as needed. Where an integrated circuit ("IC") chip includes additional transistors besides those in the CMOS gain stage 400, the additional transistors can be provided with protection as well.

In the example of FIG. 8, the drain-to-bulk junction circuitry also provides gate oxide breakdown protection. For example, considering M11, the gate and drain of M11 are coupled together, and the bulk and source of M11 are tied together. Thus, the drain-to-bulk junction voltage of M11 is the same as the gate to source voltage of M11. When, as here, the drain-to-bulk junction circuitry prevents the drain-to-bulk junction voltage from exceeding the threshold, it also necessarily prevents the gate to source voltage from exceeding the threshold.

E. PVT-Independent Gain

FIG. 6 illustrates the CMOS gain stage 400, including the optional PVT variation protection circuitry 432. The optional PVT variation circuitry 430 renders the gain of the CMOS gain stage 400 relatively independent of PVT variations. In the example of FIG. 6, the optional PVT variation protection circuitry 432 includes first and second diode-connected transistors 602 and 604, respectively, also denoted as M11 and M12, coupled between the supply node 416 and respective drain terminals of the transistors output M2 and M5. The diode-connected transistors M11 and M12 provide similar gain characteristics as the resistors 502 and 504 in FIG. 5. Additionally, where the diode-connected transistors M11 and M12 are implemented on the same integrated circuit chip as the transistors M2 and M5, PVT variations tend to affect M2, M5, M11, and M12 to the same degree. These affects tend to cancel one another out, thus rendering the gain of CMOS gain stage 400 relatively independent of PVT variations.

The gain of the CMOS gain stage 400 illustrated in FIG. 6 is given by equation 9:

$$G = \frac{gm_1}{gm_3} \cdot \frac{1}{x + \left(\frac{gm_{11}}{gm_2}\right)} \quad \text{EQ. (9)}$$

The PVT variation protection circuitry 432 also provides a measure of drain-to-bulk junction punch-through protection for M2 and M5.

F. Bandwidth Enhancement

The bandwidth of the CMOS gain stage 400 illustrated in FIGS. 5–9 is suitable for many situations. Where even greater bandwidth is desired, a zero can be introduced in the signal path. For example, FIG. 10 illustrates the CMOS gain stage 400, including the optional bandwidth enhancement circuitry 434. The optional bandwidth enhancement circuitry 434 includes gate resistances 1002 and 1004, also denoted as $R_{GATE}$, coupled between the supply node 416 and respective gates of the diode-connected transistors M11 and M12.

The gate resistances $R_{gate}$, in combination with the diode-connected transistors M11 and M12, behave similar to an active inductor. See S. Hara, IEEE Transactions on Microwave Theory and Techniques, Vol. 36, No. 12, December 1988, incorporated herein by reference in its entirety.

III. Conclusions

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software, and the like, and/or combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A CMOS gain stage, comprising:
   first and second input nodes;
   first and second input CMOS transistors having gate terminals coupled to said first and second input nodes, respectively;

first and second feedback-controlled CMOS transistors having drain terminals coupled to a supply node and source terminals coupled to drain terminals of said first and second input CMOS transistors, respectively;

first and second output CMOS transistors having gate terminals coupled to said drain terminals of said first and second input CMOS transistors, respectively, and drain terminals coupled to said supply node, wherein said first and second output CMOS transistor drain terminals form first and second output nodes, respectively; and a bias network coupled between gate terminals of said first and second feedback-controlled CMOS transistors, wherein said bias network is configured to bias said first and second feedback-controlled CMOS transistors to insure saturation of an input device in a subsequent stage without use of a source-follower circuit.

2. The apparatus according to claim 1, wherein said bias network comprises first and second resistive divider circuits, each including first and second series-connected resistances coupled between said supply node and respective said drain terminals of said first and second output CMOS transistors, said first and second resistive divider circuits including first and second divider nodes, respectively, coupled to respective gate terminals of said first and second feedback-controlled CMOS transistors.

3. The apparatus according to claim 2, wherein said supply node is coupled to a voltage source that is greater than a permitted supply voltage for a processes technology that is used to fabricate said apparatus, said apparatus further comprising drain-to-bulk junction punch-through protection circuitry coupled between said supply node and respective said first and second output CMOS transistor drain terminals.

4. The apparatus according to claim 3, wherein the drain-to-bulk junction punch-through protection circuitry provides gate-oxide breakdown protection.

5. The apparatus according to claim 3, wherein said drain-to-bulk junction punch-through protection circuitry comprises:

a third resistance coupled between said supply node and said first output CMOS transistor drain terminal; and a fourth resistance coupled between said supply node and said second output CMOS transistor drain terminal.

6. The apparatus according to claim 5, wherein said drain-to-bulk junction punch-through protection circuitry further comprises a first diode connected transistor coupled between said supply node and said third resistance and a second diode connected transistor coupled between said supply node and said fourth resistance.

7. The apparatus according to claim 6, further comprising first and second gate resistances coupled between said supply node and respective gate terminals of said first and second diode connected transistors.

8. The apparatus according to claim 3, wherein said drain-to-bulk junction punch-through protection circuitry comprises first and second diode connected transistors coupled between said supply node and respective said first and second output CMOS transistor drain terminals.

9. The apparatus according to claim 8, further comprising first and second gate resistances coupled between said supply node and respective gate terminals of said first and second diode connected transistors.

10. The apparatus according to claim 3, further comprising second drain-to-bulk junction punch-through protection circuitry coupled between said supply node and said first and second feedback-voltage-controlled CMOS transistor drain terminals.

11. The apparatus according to claim 10, wherein said first drain-to-bulk junction punch-through protection circuitry includes a third resistance coupled between said supply node and said first output CMOS transistor drain terminal, and a fourth resistance coupled between said supply node and said second output CMOS transistor drain terminal, and wherein said second drain-to-bulk junction punch-through protection circuitry comprises a fifth resistance coupled between said supply node and said first and second feedback-voltage-controlled CMOS transistor drain terminals.

12. The apparatus according to claim 11, wherein said first drain-to-bulk junction punch-through protection circuitry further comprises a first diode connected transistor coupled between said supply node and said third resistance and a second diode connected transistor coupled between said supply node and said fourth resistance.

13. The apparatus according to claim 10, further comprising:

process-voltage-temperature ("PVT") variation protection circuitry coupled between said supply node and said first drain to bulk junction punch-through protection circuitry, said PVT variation protection circuitry configured to render a gain of the CMOS gain stage substantially independent of PVT variations.

14. The apparatus according to claim 13, wherein said PVT variation protection circuitry comprises first and second diode-connected CMOS transistors having drain and gate terminals coupled to said supply node, and source terminals coupled to said first drain to bulk junction punch-through protection circuitry.

15. The apparatus according to claim 14, wherein said PVT variation protection circuitry provides drain-to-bulk junction punch-through protection for said first and second output CMOS transistors.

16. The apparatus according to claim 2, wherein said supply node is coupled to a voltage source that is greater than a permitted supply voltage for a processes technology that is used to fabricate said apparatus, said apparatus further comprising drain-to-bulk junction punch-through protection circuitry coupled between said supply node and said first and second feedback-voltage-controlled CMOS transistor drain terminals.

17. The apparatus according to claim 16, wherein said drain-to-bulk junction punch-through protection circuitry provides gate-oxide breakdown protection.

18. The apparatus according to claim 16, wherein said drain-to-bulk junction punch-through protection circuitry comprises a third resistance coupled between said supply node and said first and second feedback-voltage-controlled CMOS transistor drain terminals.

19. The apparatus according to claim 1, further comprising:

process-voltage-temperature ("PVT") variation protection circuitry coupled between said supply node and said first and second output CMOS transistor drain terminals, said PVT variation protection circuitry configured to render a gain of the CMOS gain stage substantially independent of PVT variations.

20. The apparatus according to claim 19, wherein said PVT variation protection circuitry provides drain-to-bulk junction punch-through protection for said first and second output CMOS transistors.

21. The apparatus according to claim 19, wherein said PVT variation protection circuitry comprises first and second diode-connected CMOS transistors having drain and gate terminals coupled to said supply node, and source terminals coupled to respective drain terminals of said first and second output CMOS transistors.

22. The apparatus according to claim 21, further comprising bandwidth enhancement circuitry coupled between said supply node and said gate terminals of said first and second diode-connected CMOS transistors.

23. The apparatus according to claim 22, wherein said bandwidth enhancement circuitry comprises;
   a third resistance coupled between said supply node and said first diode connected CMOS transistor gate terminal; and
   a fourth resistance coupled between said supply node and second diode connected CMOS transistor gate terminal.

24. The apparatus according to claim 1, further comprising:
   a first current source coupled to source terminal of said first and second input CMOS transistors; and
   a second current source coupled to source terminals of said first and second output CMOS transistors.

25. A method for operating a CMOS implemented gain stage implemented substantially as recited in claim 1, comprising:
   (1) providing a supply voltage to said CMOS implemented gain stage that is greater than a permitted supply voltage for a processes technology that is used to fabricate said CMOS implemented gain stage, wherein said supply voltage accomodates Vgs, Vds and IR voltage drops in said CMOS implemented gain stage;
   (2) receiving a differential signal at said first and second input nodes;
   (3) protecting transistors in said CMOS implemented gain stage from drain-to-bulk junction punch through and gate oxide breakdown;
   (4) outputting a gained-up differential signal from said first and second output nodes;
   (5) providing said gained-up differential signal to an input device in a subsequent stage; and
   (6) biasing said first and second feedback-controlled CMOS transistors using said bias network to insure saturation of said input device in said subsequent stage without use of a source-follower circuit.

26. A method for operating a CMOS implemented gain stage implemented substantially as recited in claim 1, comprising:
   means for providing a supply voltage to said CMOS implemented gain stage that is greater than a permitted supply voltage for a processes technology that is used to fabricate said CMOS implemented gain stage, wherein said supply voltage accomodates Vgs, Vds and IR voltage drops in said CMOS implemented gain stage;
   means for receiving a differential signal at said first and second input nodes;
   means for protecting transistors in said CMOS implemented gain stage from drain-to-bulk junction punch through and gate oxide breakdown;
   means for outputting a gained-up differential signal from said first and second output nodes;
   means for providing said gained-up differential signal to an input device in a subsequent stage; and
   means for biasing said first and second feedback-controlled CMOS transistors using said bias network to insure saturation of said input device in said subsequent stage without use of a source-follower circuit.

27. A CMOS gain stage, comprising:
   first and second input nodes;
   first and second input CMOS transistors having gate terminals coupled to said first and second input nodes, respectively;
   first and second feedback-controlled CMOS transistors having drain terminals coupled to a supply node and source terminals coupled to drain terminals of said first and second input CMOS transistors, respectively, wherein said supply node is coupled to a voltage supply that is greater than a permitted supply voltage for a processes technology that is used to fabricate said apparatus;
   first and second output CMOS transistors having gate terminals coupled to said drain terminals of said first and second input CMOS transistors, respectively, and drain terminals that form first and second output nodes, respectively;
   a bias network including first and second resistive divider circuits, each including first and second series-connected resistances coupled between said supply node and respective drain terminals of said first and second output CMOS transistors, said first and second resistive divider circuits including first and second divider nodes, respectively, coupled to respective gate terminals of said first and second feedback-controlled CMOS transistors, wherein said bias network biases said first and second feedback-controlled CMOS transistors to insure saturation of an input device in a subsequent stage without use of a source-follower circuit;
   first drain-to-bulk junction punch-through protection circuitry including third and fourth resistances coupled between said supply node and said first and second output CMOS transistor drain terminals, respectively, in parallel with said bias network;
   second drain-to-bulk junction punch-through protection circuitry including a fifth resistance coupled between said supply node and said first and second feedback-voltage-controlled CMOS transistor drain terminals;
   process-voltage-temperature ("PVT") variation protection circuitry coupled between said supply node and said first drain-to-bulk junction punch-through protection circuitry, said PVT variation protection circuitry including first and second diode-connected CMOS transistors having drain and gate terminals coupled to said supply node, and source terminals coupled to said first drain-to-bulk junction punch-through protection circuitry; and
   bandwidth enhancement circuitry, including sixth and seventh resistors coupled between said supply node and respective gate terminals of said first and second diode connected CMOS transistors.

28. A common mode CMOS gain stage, comprising:
   a CMOS input stage;
   a CMOS output stage coupled to said CMOS input stage; and
   a bias network coupled between said CMOS input stage and said CMOS output stage, said bias network configured to insure saturation of an input stage of a subsequent gain stage without use of a source-follower circuit, wherein the input stage of the subsequent stage is configured similarly to said CMOS input stage.

29. The apparatus according to claim 28, wherein said common mode CMOS gain stage is powered by a supply voltage that is greater than a permitted supply voltage for a processes technology that is used to fabricate said apparatus, said apparatus further comprising:

first drain-to-bulk junction punch-through protection circuitry coupled to said CMOS input stage; and second drain-to-bulk junction punch-through protection circuitry coupled to said CMOS output stage.

30. The apparatus according to claim 29, further comprising;

process-voltage-temperature ("PVT") variation protection circuitry coupled to said CMOS output stage.

31. The apparatus according to claim 29, further comprising;

bandwidth enhancement circuitry coupled to said CMOS output stage.

32. The apparatus according to claim 30, further comprising;

bandwidth enhancement circuitry coupled to said CMOS output stage.

* * * * *